United States Patent
Tani et al.

(10) Patent No.: US 8,358,675 B2
(45) Date of Patent: Jan. 22, 2013

(54) NITRIDE SEMICONDUCTOR LASER DEVICE AND WAFER

(75) Inventors: Kentaro Tani, Osaka (JP); Yoshihiko Tani, Osaka (JP); Toshiyuki Kawakami, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 113 days.

(21) Appl. No.: 12/801,800

(22) Filed: Jun. 25, 2010

(65) Prior Publication Data

US 2010/0329294 A1 Dec. 30, 2010

(30) Foreign Application Priority Data

Jun. 29, 2009 (JP) .................................. 2009-153470

(51) Int. Cl.
*H01S 3/097* (2006.01)

(52) U.S. Cl. ............... 372/87; 372/43.01; 372/38.05; 372/50.1; 372/50.12; 257/99; 257/690; 257/773; 257/E33.005

(58) Field of Classification Search .................. 372/87, 372/43.01, 38.05, 50.1, 50.12; 257/91, 99, 257/690, 773, E33.005, 23.151
See application file for complete search history.

(56) References Cited

U.S. PATENT DOCUMENTS

| | | | |
|---|---|---|---|
| 6,444,998 B1 * | 9/2002 | Taniguchi et al. | 257/13 |
| 6,630,366 B2 * | 10/2003 | Taniguchi et al. | 438/34 |
| 7,092,419 B2 * | 8/2006 | Woodley et al. | 372/38.05 |
| 7,410,819 B2 | 8/2008 | Takakura et al. | |
| 7,700,963 B2 | 4/2010 | Takakura et al. | |
| 7,804,787 B2 * | 9/2010 | Brandyburg et al. | 370/252 |
| 8,059,691 B2 * | 11/2011 | Yamasaki | 372/87 |
| 8,130,804 B2 * | 3/2012 | Nakashima et al. | 372/46.014 |
| 2002/0060316 A1 | 5/2002 | Matsuyama | 257/12 |
| 2003/0038294 A1 | 2/2003 | Sano | 257/91 |
| 2004/0206975 A1 * | 10/2004 | Tojo et al. | 257/103 |
| 2004/0245540 A1 | 12/2004 | Hata et al. | |
| 2006/0131590 A1 | 6/2006 | Takakura et al. | |
| 2006/0171435 A1 | 8/2006 | Ohshima et al. | 372/43.01 |
| 2007/0165685 A1 * | 7/2007 | Mizuuchi et al. | 372/38.05 |
| 2007/0286252 A1 * | 12/2007 | Ha et al. | 372/50.12 |
| 2008/0063021 A1 * | 3/2008 | Seo | 372/87 |
| 2008/0283866 A1 | 11/2008 | Takakura et al. | |
| 2012/0007122 A1 * | 1/2012 | Choi | 257/98 |
| 2012/0007129 A1 * | 1/2012 | Beom et al. | 257/98 |

FOREIGN PATENT DOCUMENTS

| | | |
|---|---|---|
| JP | 2002-164622 | 6/2002 |
| JP | 2004-273752 | 9/2004 |
| JP | 2005-108917 | 4/2005 |
| JP | 2005-109087 | 4/2005 |
| JP | 2005-322786 | 11/2005 |
| JP | 2006-128558 | 5/2006 |
| JP | 2006-190980 | 7/2006 |
| JP | 2009-194307 | 8/2009 |
| WO | WO 01/61804 | 8/2001 |

* cited by examiner

*Primary Examiner* — Jessica Stultz
*Assistant Examiner* — Delma R Forde
(74) *Attorney, Agent, or Firm* — Harness, Dickey & Pierce, P.L.C.

(57) ABSTRACT

Provided is a nitride semiconductor laser device that is reduced in capacitance to have a better response. The nitride semiconductor laser device includes: an active layer; an upper cladding layer which is stacked above the active layer; a low dielectric constant insulating film which is stacked above the upper cladding layer; and a pad electrode which is stacked above the low dielectric constant insulating film.

3 Claims, 6 Drawing Sheets

NITRIDE SEMICONDUCTOR LASER DEVICE AND WAFER

The present application claims priority from Japanese Patent Application No. 2009-153470 filed on Jun. 29, 2009, the content of which is hereby incorporated by reference into this application.

BACKGROUND OF THE INVENTION

1. Field of the Invention

The present invention relates to a wafer in which a plurality of nitride semiconductor laser devices to be separated from one another are arranged, and to a nitride semiconductor laser device obtained from the wafer.

2. Description of Related Art

Nitride semiconductor laser devices, which are utilized in the recording and playing of a Blu-ray disc or the like and other uses, are being actively researched and developed. For example, to record information at a high density, turning laser light on and off fast is required and a laser device is accordingly driven with short pulses of approximately 20 ns. In pulsed operation, where a laser device exhibits a better response when its impedance is smaller, reducing the resistance that is observed during driving is important, as well as reducing the capacitance of the laser device. To reproduce information, on the other hand, a laser device is required to be reliable and raising the electrostatic discharge withstand voltage is important for the reliability of the laser device.

In the manufacture of a nitride semiconductor laser device, the crystallinity of a layered laser structure is improved commonly by digging grooves in a substrate before crystals are grown (see JP 2005-322786 A and JP 2006-190980 A). The grooves make the layers thicker in its vicinity and, in order to efficiently obtain laser devices that have identical optical characteristics from a single substrate, ridges for optical waveguides are formed at a distance from the grooves. This means that, when a plurality of devices, 102 to 104, are set between a groove 101a and a groove 101b as in FIG. 6, which is a top view of a wafer 100, one of the devices (in FIG. 6, the device 104) is always reverse to the rest of the devices (in FIG. 6, the devices 102 and 103) in terms of the placement of the ridge. Specifically, the ridge of the one device (a ridge 104a in FIG. 6) needs to be formed on the left-hand side of the device whereas the ridges of the rest of the devices (ridges 102a and 103a in FIG. 6) are formed on the right-hand side of the devices, or vice versa.

Two types of devices having different structures are thus fabricated from the wafer 100, and need to be discriminated from each other in, for example, a device characteristics test. This is because the two types of devices have different emission spots, and the point of introduction of light into an optical fiber or a tester needs to be changed accordingly when the devices are tested for emission wavelength or the like in a characteristics test. A difference in pad electrode shape, for example, can be used to discriminate one type from the other. In this case, the difference in pad electrode shape needs to be large enough to be recognizable on image in a tester or a chip mounter.

When devices having different structures are to be discriminated from one another by their pad electrode shapes, the difference in pad electrode shape or pad electrode area between the devices needs to be large for easier image recognition, as described above. However, varying the pad electrode area from one structure to another means that devices of different capacitances are fabricated from a single wafer, and creates the following inconvenience.

When a nitride semiconductor laser device is used to record information, a high frequency superposition circuit is usually employed as a countermeasure for optical feedback noise. The high frequency superposition circuit needs to be adjusted for each laser device if laser devices having different capacitances are used. This causes an increase in cost and a reduction in productivity, and is therefore impractical for actual mass production.

SUMMARY OF THE INVENTION

The present invention has been made in view of the above, and an object of the present invention is therefore to provide a nitride semiconductor laser device that is reduced in capacitance to have a better response. Another object of the present invention is to provide a nitride semiconductor laser device that has a high electrostatic discharge withstand voltage to be improved in reliability. Still another object of the present invention is to provide a way to harvest from a single wafer a plurality of nitride semiconductor laser devices of different structures that have the same capacitance and that can be discriminated from one another on image by their structures.

In order to achieve the above-mentioned object, the present invention provides a nitride semiconductor laser device including: an active layer; an upper cladding layer which is stacked above the active layer; a low dielectric constant insulating film which is stacked above the upper cladding layer; and a pad electrode which is stacked above the low dielectric constant insulating film.

According to this structure, the use of the low dielectric constant insulating film lowers the capacitance of the nitride semiconductor laser device.

In the nitride semiconductor laser device, it is preferable that the active layer has underlying layers each of which is an n-type layer and each layer above the active layer is a p-type layer. This is because the p-type layer is higher in resistance.

In the nitride semiconductor laser device, one of SiOF, SiOC, and an organic polymer may be employed for the low dielectric constant insulating film.

Further, the present invention provides a nitride semiconductor laser device, including: an active layer; an upper cladding layer which is stacked above the active layer; a high dielectric constant insulating film which is stacked above the upper cladding layer; and a pad electrode which is stacked above the high dielectric constant insulating film.

According to this structure, the use of the high dielectric constant insulating film increases the capacitance of the nitride semiconductor laser device.

In the nitride semiconductor laser device, it is preferable that the active layer has underlying layers each of which is an n-type layer and each layer above the active layer is a p-type layer. This is because the p-type layer is higher in resistance.

In the nitride semiconductor laser device, one of an $HfO_2$-based film and an $Al_2O_3N$-based film may be employed for the high dielectric constant insulating film.

Further, the present invention provides a wafer including a plurality of nitride semiconductor laser devices which are to be separated from, one another, in which the plurality of nitride semiconductor laser devices each include at least one pad electrode that is electrically isolated, and in which, of the plurality of nitride semiconductor laser devices, at least nitride semiconductor laser devices that differ from one another in structure have an equal area of a pad electrode to which a voltage is applied, and have different overall pad electrode shapes.

According to this structure, giving the laser devices an equal pad electrode area to which a voltage is applied renders the laser devices uniform in capacitance, and the difference in overall pad electrode shape makes the structures of the laser devices discriminable from one another through image recognition.

In the wafer, the at least one pad electrode is desirably electrically isolated by a groove.

Further, the present invention provides a wafer including a plurality of nitride semiconductor laser devices which are to be separated from one another, in which the plurality of nitride semiconductor laser devices each have an equal area of pad electrode, and include a low reflection part in a part of a surface of the pad electrode which is created by treatment that lowers reflectance, and in which, of the plurality of nitride semiconductor laser devices, at least nitride semiconductor laser devices that have different structures differ from one another in a shape of the low reflection part.

According to this structure, giving the laser devices an equal pad electrode area renders the laser devices uniform in capacitance, and the difference in low reflection part shape makes the structures of the laser devices discriminable from one another through image recognition.

In the wafer, the low reflection part is desirably formed from a low reflection film that is lower in reflectance than the pad electrode.

Further, in the wafer, the low reflection part may be formed by roughening the surface of the pad electrode.

According to the present invention, a nitride semiconductor laser device is reduced in capacitance, which gives the nitride semiconductor laser device a better response and increases the noise reduction effect of a high frequency superposition circuit.

Further, according to the present invention, a nitride semiconductor laser device is increased in capacitance, which gives the nitride semiconductor laser device an improved electrostatic discharge damage threshold (electrostatic discharge withstand voltage) and an enhanced reliability.

Still further, according to the present invention, in harvesting a plurality of nitride semiconductor laser devices of different structures from a single wafer, the laser devices are given a uniform capacitance to facilitate the adjustment to a high frequency superposition circuit and accordingly lower the manufacture cost, as well as to make the different structures of the laser devices discriminable from one another on image.

DETAILED DESCRIPTION OF PREFERRED EMBODIMENTS

The inventors of the present invention has made an extensive research on the capacitance of nitride semiconductor laser devices and obtained the following knowledge. In AlGaAs-based laser devices and AlGaInP-based laser devices, the area of a PN junction of the laser device determines the capacitance. This is why a trench structure (created by digging a groove beside a ridge) or a similar measure has been necessary to reduce the capacitance. In a PN junction, what influences the capacitance of a nitride semiconductor laser device having a ridge guide device structure is the product of the ridge width plus a few µm and the resonator length. The rest are how large a pad electrode area is necessary for wire bonding for external voltage application via a wire on a contact electrode or the like, and the dielectric constant and thickness of a dielectric film under a pad electrode.

This is because an AlGaN layer and a GaN layer in a p-type cladding layer that is used in a nitride semiconductor laser device are very high in resistance. Usually, a ridge guide laser device has a ridge width of approximately 1 to 2 µm and is thinned outside a ridge by etching a cladding layer. The thickness of the laser device outside the ridge from an active layer to the top of the cladding layer is approximately 0.1 to 0.3 µm. On the outside of the ridge, no contact electrode is usually formed and the ridge sides are covered with a dielectric film to guide light in a lateral direction, which raises the lateral resistance outside the ridge. The high resistance causes a voltage applied from the ridge to drop as the distance from the ridge increases, with the result that no voltage is applied to a PN junction area distanced from the ridge. Accordingly, an area distanced from the ridge to which no voltage is applied does not influence the capacitance of the laser device.

A pad electrode made of Ti, Pd, Ni, or Au is on top of a dielectric film, which is on top of a p-type AlGAN, GaN, or InGaN layer above a PN junction. The pad electrode, the dielectric film, and an n-type electrode constitute a capacitor. This phenomenon occurs in a PN junction area that is distanced from a ridge where no voltage is applied because, as mentioned above, a voltage drops as the distance from a ridge increases.

When the capacitance at a PN junction near a ridge is given as A and the capacitance between a pad electrode and an n-type (or a conductivity type opposite to that of the pad electrode) electrode is given as B, the capacitance of the laser device is A+B. This capacitance relation is established because a capacitor A near a ridge (including the ridge) and a capacitor B between a pad electrode and an n-type (or a conductivity type opposite to that of the pad electrode) electrode have a parallel relation.

Four embodiments of the present invention are described below in order.

First Embodiment

Figure 1:
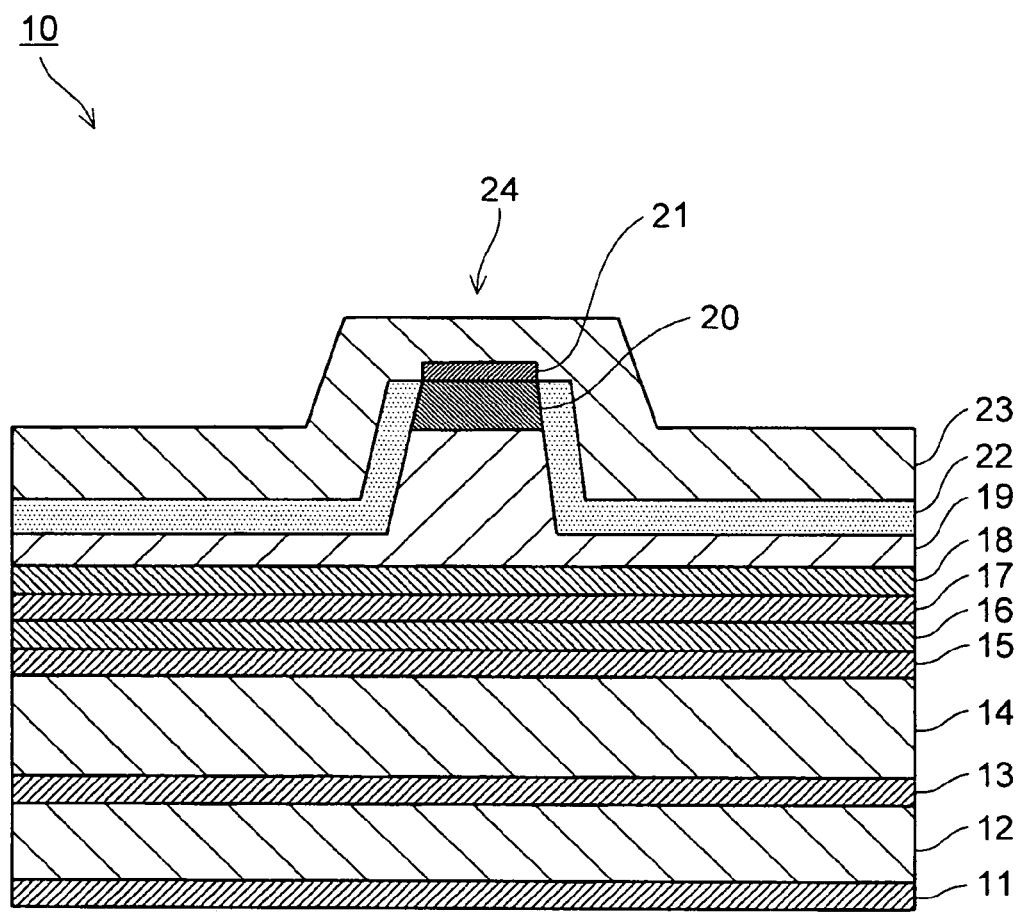
FIG. 1 is a sectional view of a nitride semiconductor laser device according to a first embodiment.

FIG. 1 is a sectional view of a nitride semiconductor laser device according to a first embodiment. The nitride semiconductor laser device denoted by 10 is built by stacking an n-type electrode 11, an n-type GaN substrate 12, an n-type GaN buffer layer 13, an n-type AlGaN cladding layer 14, an n-type GaN/InGaN light guiding layer 15, a non-doped GaN/InGaN active layer 16, a p-type AlGaN vaporization preventing layer 17, a p-type GaN or AlGaN interlayer 18, a p-type AlGaN cladding layer 19, a p-type GaN contact layer 20, a Pd contact electrode 21, a low dielectric constant insulating film 22, and a Ti/Au pad electrode 23.

The nitride semiconductor laser device 10 is manufactured by first growing, on the n-type GaN substrate 12, by metal organic chemical vapor deposition (hereinafter abbreviated as MOCVD), the n-type GaN buffer layer 13, the n-type AlGaN cladding layer 14, the n-type GaN/InGaN light guiding layer 15, the non-doped GaN/InGaN active layer 16, the p-type AlGaN vaporization preventing layer 17, the p-type GaN or AlGaN interlayer 18, the p-type AlGaN cladding layer 19, and the p-type GaN contact layer 20 sequentially.

Next, the Pd contact electrode 21 is formed on the p-type GaN contact layer 20 and then the stack is etched down to a point in the p-type AlGaN cladding layer 19 by photolithography and dry etching, to thereby form ridges 24 in a stripe pattern. An SiOF film to constitute the low dielectric constant insulating film 22 is formed by sputtering to a thickness of approximately 100 nm, so as to cover ridge sides. Parts of the SiOF film that are above the ridges 24 are removed by etching.

The Ti/Au pad electrode 23 is formed next. The rear surface of the n-type GaN substrate 12 is polished to be thinned down to approximately 100 μm, and then subjected to rear surface treatment. Thereafter, an Ni/Au film or the like is formed as the n-type electrode 11 on the treated rear surface.

The stack is then cleaved along a plane perpendicular to the ridges 24 to form resonator mirrors. A dielectric film (made of $Al_2O_3$, $SiO_2$, $TiO_2$, or the like) is formed on the cleaved surface. The stack is then scribed between stripes and broken along the scribe lines into pieces to obtain a desired nitride semiconductor laser device 10.

The capacitance of the nitride semiconductor laser device 10 manufactured in this manner is approximately 6 pF, and is lower than the capacitance of a nitride semiconductor laser device that uses an insulating film different from the low dielectric constant insulating film 22, which is approximately 10 pF. As a result, the nitride semiconductor laser device 10 has a better response and enhances the noise reduction effect brought by a high frequency superposition circuit to a degree that the relative intensity of noise (RIN) at 3 to 5 mW is −125 dB or less (conventionally, −125 dB or less).

The low dielectric constant insulating film 22 uses a low dielectric constant material in which the dielectric constant k value is, for example, 5 or less. While an SiOF film is used here as the low dielectric constant insulating film 22, the same effect is obtained with an SiOC film or an organic polymer film. An organic polymer suitable for the low dielectric constant insulating film 22 is, for example, a borazine-silicon polymer.

Second Embodiment

Figure 2:
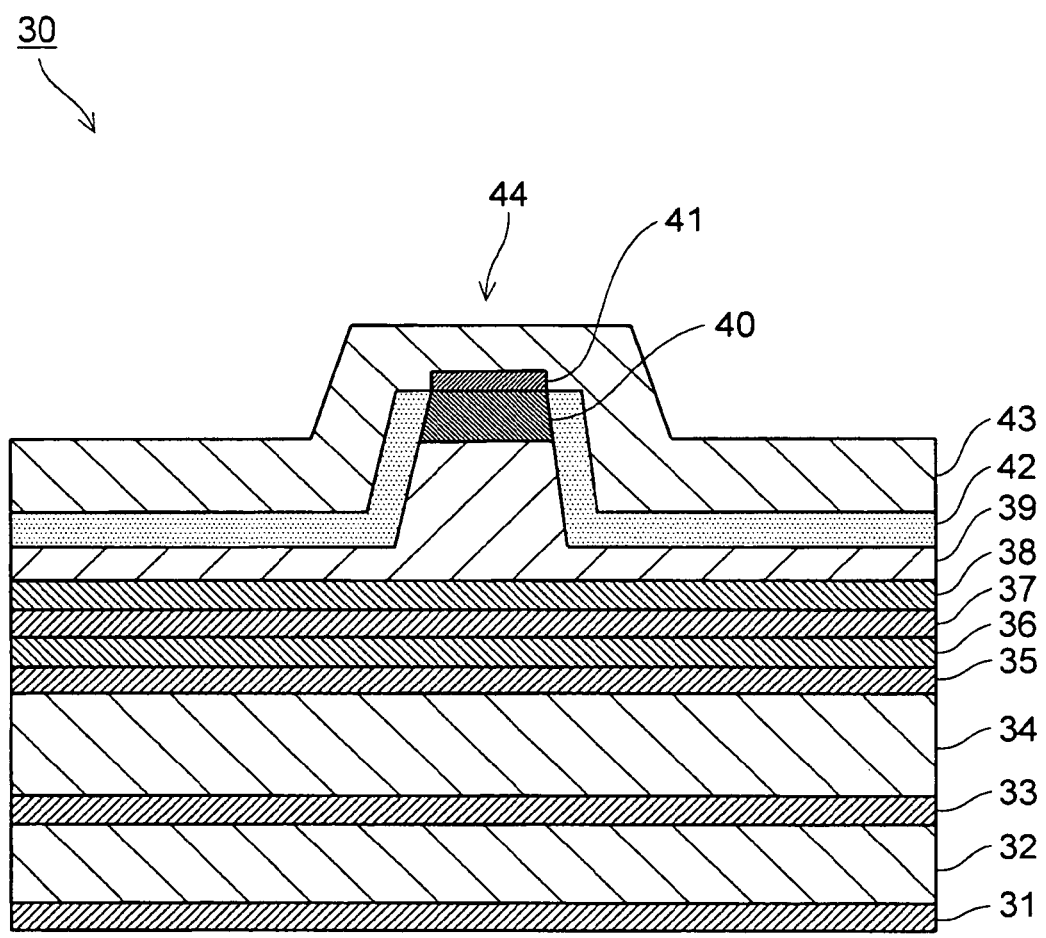
FIG. 2 is a sectional view of a nitride semiconductor laser device according to a second embodiment.

FIG. 2 is a sectional view of a nitride semiconductor laser device according to a second embodiment. The nitride semiconductor laser device denoted by 30 is built by stacking an n-type electrode 31, an n-type GaN substrate 32, an n-type GaN buffer layer 33, an n-type AlGaN cladding layer 34, an n-type GaN/InGaN light guiding layer 35, a non-doped GaN/InGaN active layer 36, a p-type GaN or AlGaN interlayer 37, a p-type AlGaN vaporization preventing layer 38, a p-type AlGaN cladding layer 39, a p-type GaN contact layer 40, a Pd contact electrode 41, a high dielectric constant insulating film 42, and a Ti/Au pad electrode 43.

The nitride semiconductor laser device 30 is manufactured by first growing, on the n-type GaN substrate 32, by metal organic chemical vapor deposition (hereinafter abbreviated as MOCVD), the n-type GaN buffer layer 33, the n-type AlGaN cladding layer 34, the n-type GaN/InGaN light guiding layer 35, the non-doped GaN/InGaN active layer 36, the p-type GaN or AlGaN interlayer 37, the p-type AlGaN vaporization preventing layer 38, the p-type AlGaN cladding layer 39, and the p-type GaN contact layer 40 sequentially.

Next, the Pd contact electrode 41 is formed on the p-type GaN contact layer 40 and then the stack is etched down to a point in the p-type AlGaN cladding layer 39 by photolithography and dry etching, to thereby form ridges 44 in a stripe pattern. An $HfO_2$ film to constitute the high dielectric constant insulating film 42 is formed by sputtering to a thickness of approximately 100 nm, so as to cover ridge sides. Parts of the $HfO_2$ film that are above the ridges 44 are removed by etching.

The Ti/Au pad electrode 43 is formed next. The rear surface of the n-type GaN substrate 32 is polished to be thinned down to approximately 100 μm, and then subjected to rear surface treatment. Thereafter, an Ni/Au film or the like is formed as the n-type electrode 31 on the treated rear surface.

The stack is then cleaved along a plane perpendicular to the ridges 44 to form resonator mirrors. A dielectric film (made of $Al_2O_3$, $SiO_2$, $TiO_2$, or the like) is formed on the cleaved surface. The stack is then scribed between stripes and broken along the scribe lines into pieces to obtain a desired nitride semiconductor laser device 30.

The capacitance of the nitride semiconductor laser device 30 manufactured in this manner is approximately 20 pF, and is higher than the capacitance of a nitride semiconductor laser device that uses an insulating film different from the high dielectric constant insulating film 42 which is approximately 10 pF. As a result, the nitride semiconductor laser device 30 has favorable characteristics in which the electrostatic discharge damage threshold (electrostatic discharge withstand voltage) is improved to 150 V or higher (conventionally 70 V or higher) at a resonator length of 400 μm.

The high dielectric constant insulating film 42 uses a high dielectric constant material in which the dielectric constant k value is, for example, 90 or more. While an $HfO_2$ film is used above as the high dielectric constant insulating film 42, the same effect is obtained with an $Al_2O_3N$-based film. The $Al_2O_3N$-based film here refers to an AlON film, an $AlO_2N$ film, an $Al_2ON$ film, and the like.

Third Embodiment

A third embodiment of the present invention uses a processed substrate that is an n-type GaN substrate with grooves formed in a stripe pattern in its top face (epitaxy face). The processed substrate is manufactured by first forming an $SiO_2$ film or the like on the top face of an n-type GaN substrate by sputtering evaporation to a thickness of 1 μm, and forming a stripe photoresist pattern by a common lithography process such that the photoresist pattern has a width of 5 μm at a resist opening and an interval (cycle) of 400 μm between the center of a stripe and the center of an adjacent stripe.

Next, the $SiO_2$ film and the n-type GaN substrate are etched by dry etching such as reactive ion etching (RIE) technology to form grooves each having a depth of 5 μm and an opening width of 5 μm. The $SiO_2$ film is then removed with the use of an etchant such as HF, to thereby obtain the processed substrate.

The deposition by evaporation of $SiO_2$ is not limited to sputtering evaporation, and electron beam evaporation, plasma CVD, or the like may be employed instead. The cycle of the resist pattern is not limited to 400 μm, which is described above, and may be changed to suit the width of a nitride semiconductor laser device manufactured. The dry etching for digging the grooves may be replaced by wet etching.

Figure 3:
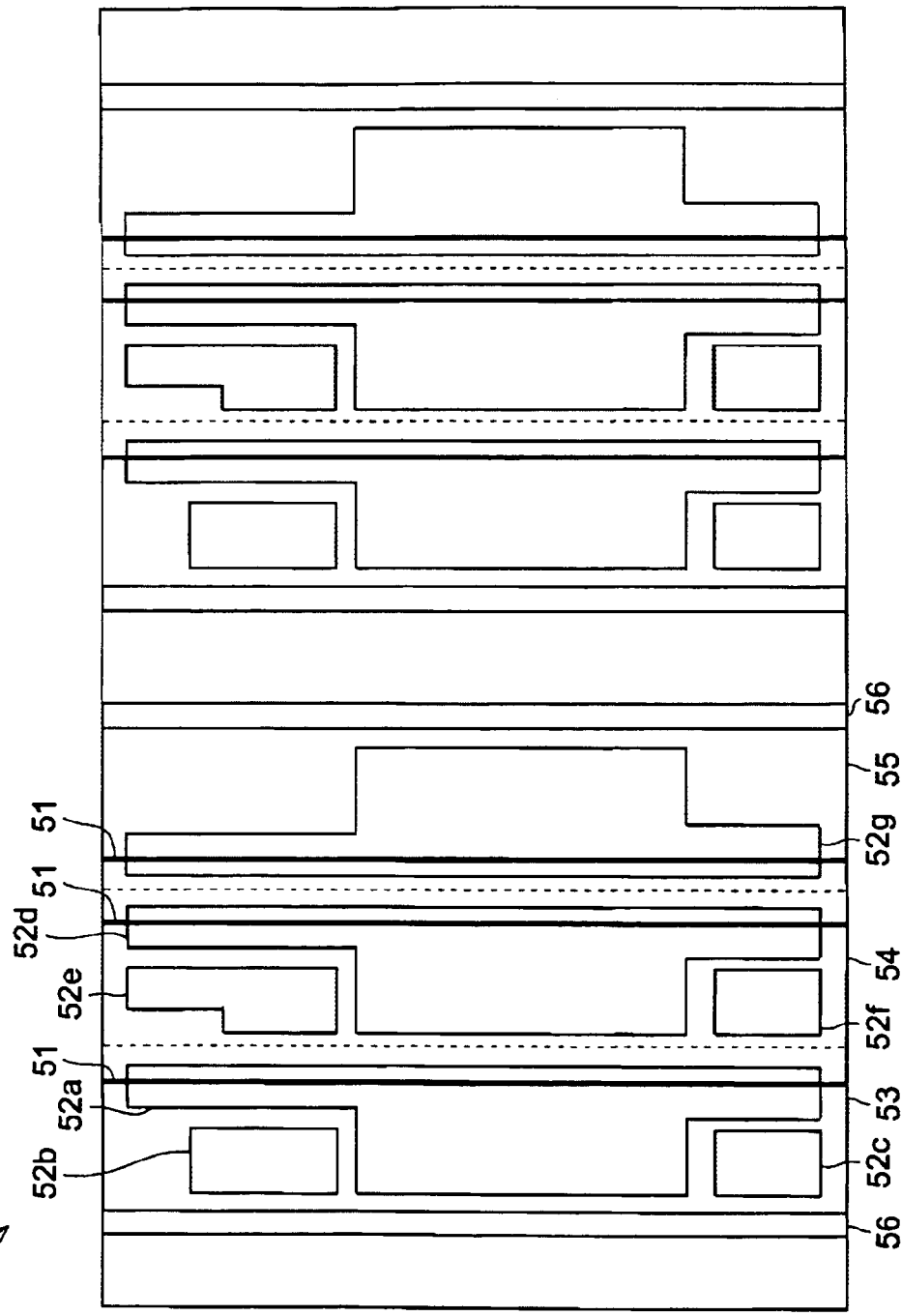
FIG. 3 is a top view of a wafer according to a third embodiment.

FIG. 3 is a top view of a wafer according to the third embodiment. The wafer, denoted by 50, is broken into nitride semiconductor laser devices each of which is built by stacking an n-type electrode, a processed substrate, an n-type GaN buffer layer, an n-type AlGaN cladding layer, an n-type GaN/InGaN light guiding layer, a non-doped GaN/InGaN active layer, a p-type GaN or AlGaN interlayer, a p-type AlGaN vaporization preventing layer, a p-type AlGaN cladding layer, a p-type GaN contact layer, a Pd contact electrode, a dielectric film, and a Ti/MO/Au pad electrode.

The nitride semiconductor laser device 10 is manufactured by first growing, on the processed substrate, by metal organic chemical vapor deposition (hereinafter abbreviated as MOCVD), the n-type GaN buffer layer, the n-type AlGaN cladding layer, the n-type GaN/InGaN light guiding layer, the non-doped GaN/InGaN active layer, the p-type GaN or AlGaN interlayer, the p-type AlGaN vaporization preventing layer, the p-type AlGaN cladding layer, and the p-type GaN contact layer sequentially.

Next, the Pd contact electrode is formed on the p-type GaN contact layer and then the stack is etched down to a point in the p-type AlGaN cladding layer by photolithography and dry etching, to thereby form ridges in a stripe pattern. An $SiO_2$ film to constitute the dielectric film is formed by sputtering to a thickness of approximately 100 nm, so as to cover ridge sides. Parts of the $SiO_2$ film that are above the ridges 51 are removed by etching.

Next, resist is applied and a pad electrode pattern is formed such that photo etching leaves the resist in unnecessary areas. Ti/MO/Au pad electrodes are then formed by electron beam evaporation. Unnecessary parts of the pad electrodes are removed by lift-off to ultimately obtain pad electrodes 52a to 52g illustrated in FIG. 3. In FIG. 3, three laser devices are formed between one groove 56 and another groove 56 which are created as a result of stacking the layers on the grooves in the processed substrate.

The pad electrodes 52a to 52g may be formed by another method in which a Ti/MO/Au film is formed by sputtering or electron beam evaporation on the entire top face of the wafer 50, resist is applied, and a pad electrode pattern is formed such that photo etching leaves the resist in necessary areas, and unnecessary parts of pad electrodes are removed with an iodine-based etchant.

The pad electrodes 52a, 52d, and 52g formed on ridges 51 are pad electrodes in which wire bonding is performed, i.e., pad electrodes to which a voltage is applied. The pad electrodes 52a, 52d, and 52g to which a voltage is applied are designed to have an equal area in order to give their laser devices the same capacitance.

The pad electrodes 52b, 52c, 52e, and 52f, on the other hand, are pad electrodes in which wire bonding is not performed, i.e., pad electrodes to which no voltage is applied, and which are not formed on the ridges 51. The pad electrodes 52b, 52c, 52e, and 52f are electrically isolated by forming grooves in areas between the pad electrodes 52b, 52c, 52e, and 52f and the pad electrodes 52a, 52d, and 52g to which a voltage is applied (areas where no pad electrode is formed).

Each nitride semiconductor laser device obtained by breaking the wafer into pieces is designed such that all pad electrodes in one device together form a shape different from the overall pad electrode shape of another device. For example, the overall shape of the pad electrodes 52a to 52c, the overall shape of the pad electrodes 52d to 52f, and the shape of the pad electrode 52g differ from one another.

This is because, while devices 53 and 54 have the same structure, a device 55 has a reverse structure in terms of the placement of the ridge. Specifically, the device 55 has a ridge on the left-hand side whereas the devices 53 and 54 have ridges on the right-hand side, or vice versa. The coexistence of two types of devices of different structures necessitates discrimination between the two types of devices in, for example, a device characteristics test. Because the two types of devices have different emission spots, the point of introduction of light into an optical fiber or a tester needs to be changed accordingly when the devices are tested for emission wavelength or the like in a characteristics test. The difference in pad electrode shape is used to discriminate one type from the other through image recognition in a tester or a chip mounter.

Accordingly, the overall pad electrode shape needs to be varied such that at least the discrimination of the device 55 from the devices 53 and 54 is possible. The devices 53 and 54 which have the same structure does not need to be discriminated from each other, but, in FIG. 3, where the pad electrode 52b and the pad electrode 52e have different shapes, are discriminable from each other.

Returning to the description of how the nitride semiconductor laser device is manufactured, the rear surface of the processed substrate is polished to be thinned down to approximately 100 μm, and then subjected to rear surface treatment. Thereafter, an Ni/Au film or the like is formed as the n-type electrode on the treated rear surface.

The stack is then cleaved along a plane perpendicular to the ridges 51 to form resonator mirrors. A dielectric film (made of $Al_2O_3$, $SiO_2$, $TiO_2$, or the like) is formed on the cleaved surface. The stack is then scribed between stripes and broken along the scribe lines into pieces to obtain desired nitride semiconductor laser devices 53 to 55.

The capacitance of the nitride semiconductor laser devices 53 to 55 manufactured in this manner is approximately 10 pF. By thus giving the devices 53 to 55a uniform capacitance, the adjustment of a high frequency superposition circuit is facilitated and the manufacture cost is reduced by approximately 10%.

With the structure of this embodiment, a plurality of nitride semiconductor laser devices harvested from a single wafer and having different structures can have the same capacitance and can be discriminated from one another by their structures through image recognition.

Fourth Embodiment

Figure 4:
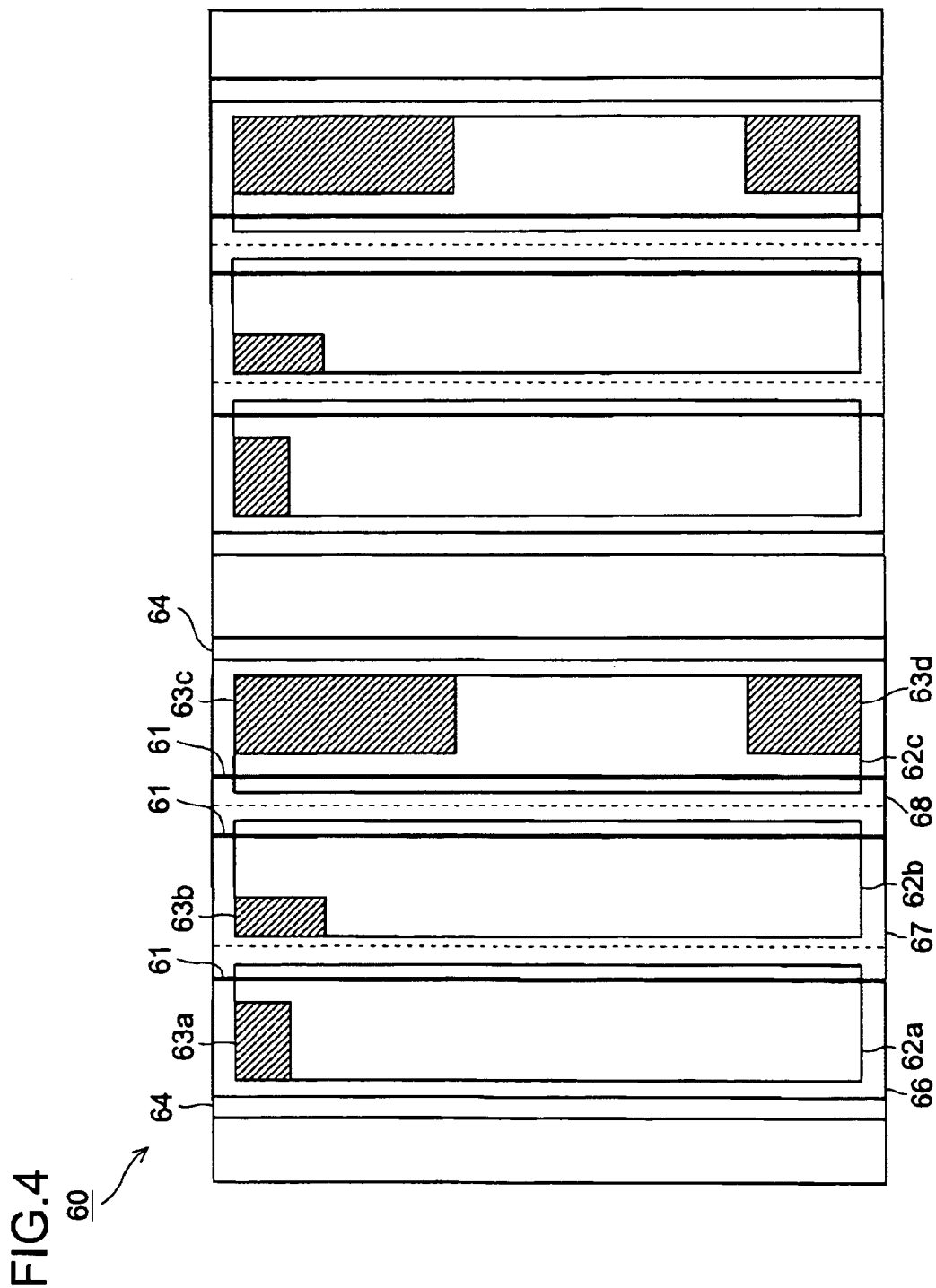
FIG. 4 is a top view of a wafer according to a fourth embodiment.

FIG. 4 is a top view of a wafer according to the fourth embodiment. The wafer, denoted by 60, is broken into nitride semiconductor laser devices each of which is built by stacking an n-type electrode, a processed substrate, an n-type GaN buffer layer, an n-type AlGaN cladding layer, an n-type GaN/InGaN light guiding layer, a non-doped GaN/InGaN active layer, a p-type GaN or AlGaN interlayer, a p-type AlGaN vaporization preventing layer, a p-type AlGaN cladding layer, a p-type GaN contact layer, a Pd contact electrode, a dielectric film, and a Ti/MO/Au pad electrode.

The nitride semiconductor laser device 10 is manufactured by first growing, on the processed substrate, by metal organic chemical vapor deposition (hereinafter abbreviated as MOCVD), the n-type GaN buffer layer, the n-type AlGaN cladding layer, the n-type GaN/InGaN light guiding layer, the non-doped GaN/InGaN active layer, the p-type GaN or AlGaN interlayer, the p-type AlGaN vaporization preventing layer, the p-type AlGaN cladding layer, and the p-type GaN contact layer sequentially.

Next, the Pd contact electrode is formed on the p-type GaN contact layer and then the stack is etched down to a point in the p-type AlGaN cladding layer by photolithography and dry etching, to thereby form ridges 61 in a stripe pattern. An $SiO_2$ film to constitute the dielectric film is formed by sputtering to a thickness of approximately 100 nm, so as to cover ridge sides. Parts of the $SiO_2$ film that are above the ridges 61 are removed by etching.

Next, a Ti/MO/Au film to constitute pad electrodes is formed on the entire top face of the wafer 60 by sputtering or electron beam evaporation. A low reflection film that does not have metallic luster is subsequently formed from SiO$_2$ by evaporation to a thickness that is not recognized in image recognition. Resist is applied onto the SiO$_2$ film and a pad electrode pattern is formed such that photo etching leaves the resist in necessary areas. Unnecessary parts of the SiO$_2$ film are removed by an etchant such as buffered hydrofluoric acid.

Pad electrodes 62a to 62c and low reflection films 63a to 63d are thus obtained as illustrated in FIG. 4. In FIG. 4, three laser devices are formed between one groove 64 and another groove 64 which are created as a result of stacking the layers on the grooves in the processed substrate.

The low reflection films 63a to 63d may use other materials than SiO$_2$ as long as the reflectance of the employed material is lower than that of the pad electrodes 62a to 62c. Instead of the low reflection films, treatment may be employed for giving a pad electrode a lower reflectance than that of an unprocessed pad electrode, such as treatment that roughens a pad electrode surface. This part on a pad electrode where the reflectance is low is called a low reflectance part.

Figure 5:
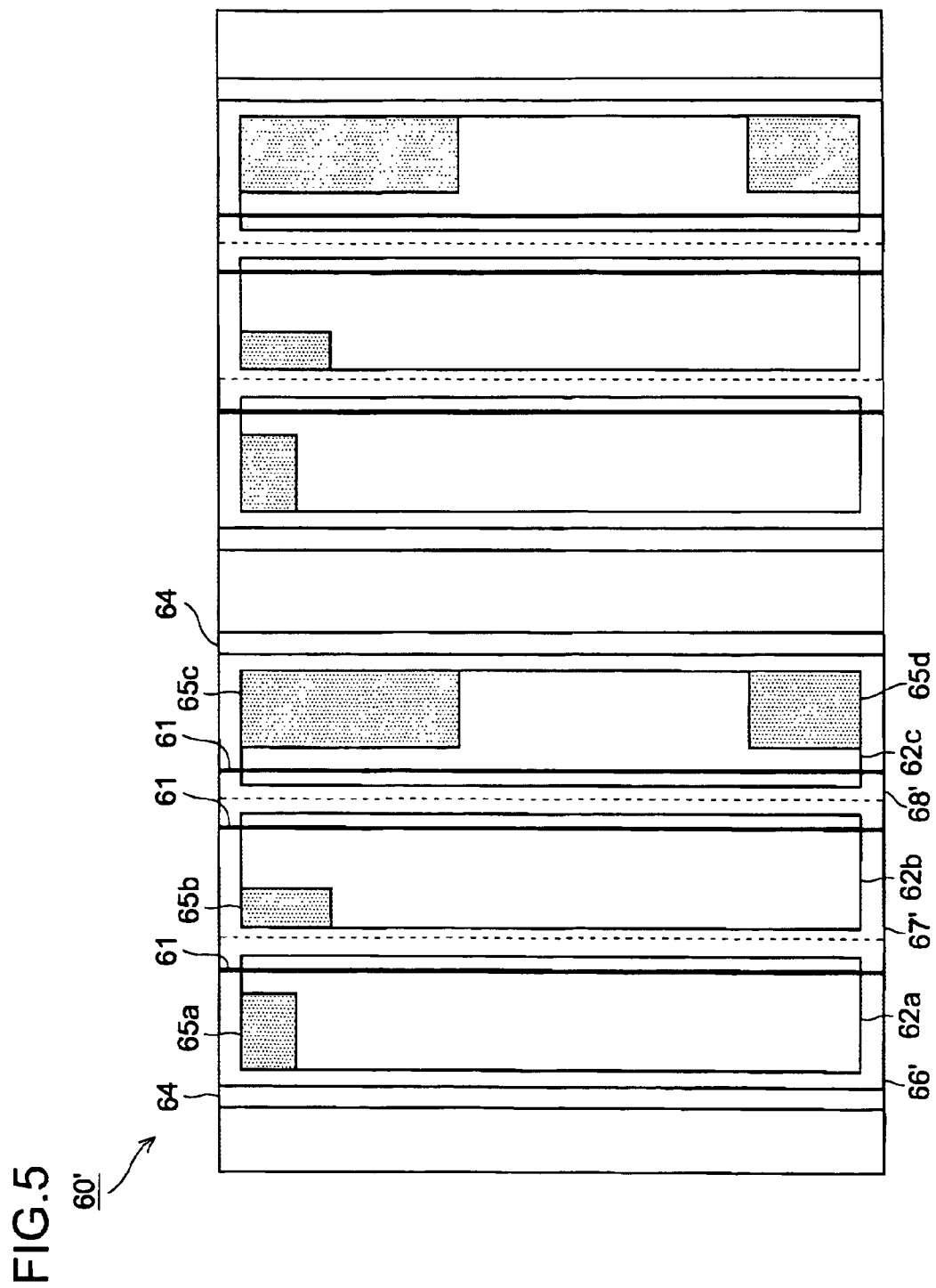
FIG. 5 is a top view of another wafer according to the fourth embodiment.
Figure 6:
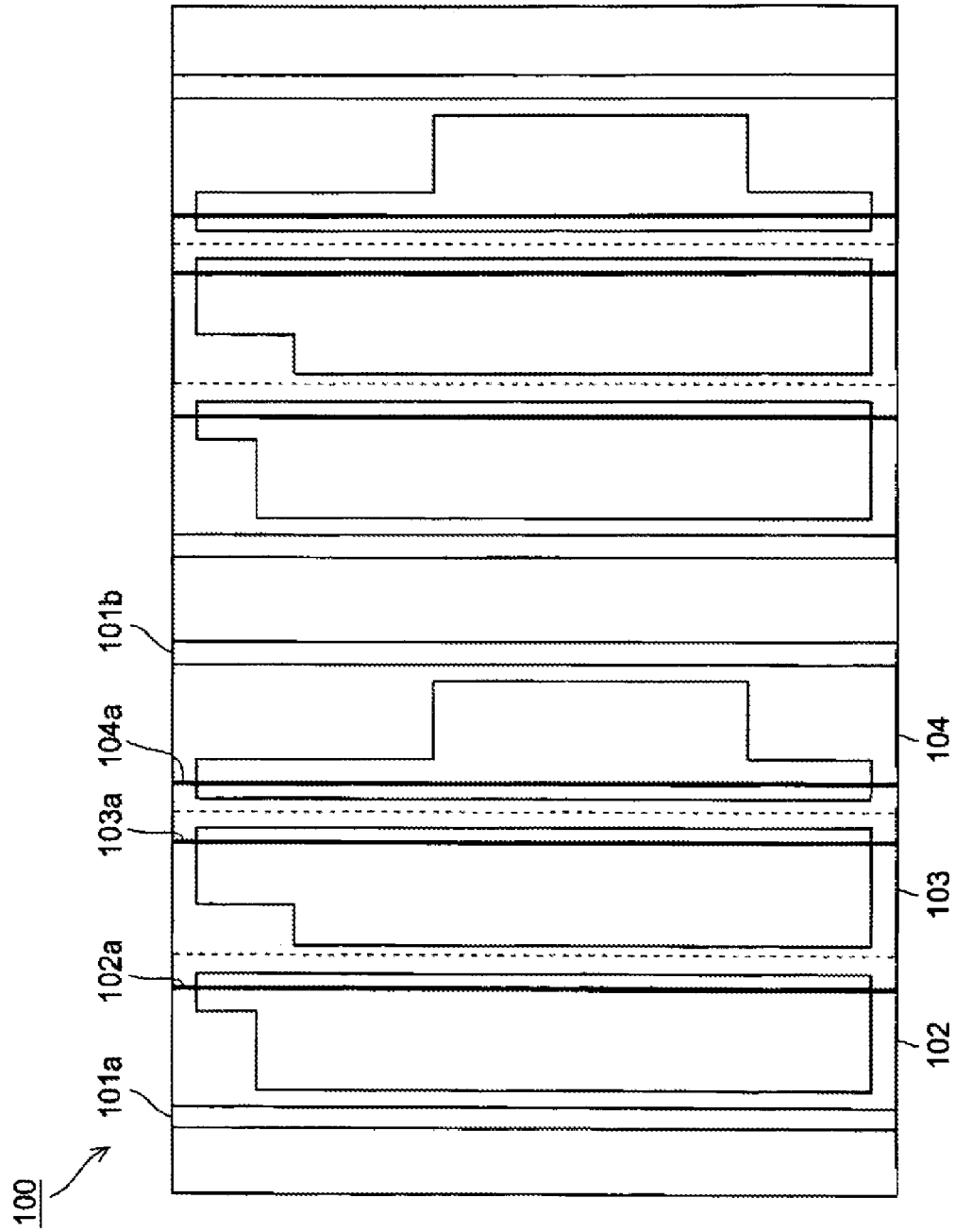
FIG. 6 is a top view of a conventional wafer.

Specifically, the pad electrode surface roughening treatment uses an etchant such as hydrochloric acid, and is performed on a pad electrode surface after a Ti/MO/Au film to constitute pad electrodes is formed on the entire top face of the wafer 60 by sputtering or electron beam evaporation, resist is applied onto the Ti/MO/Au film, and a pad electrode pattern is formed such that photo etching leaves the resist in necessary areas. FIG. 5 is a top view of a wafer 60' in which a pad electrode surface has been roughened. Roughened parts of the pad electrode surface are illustrated as surface-treated parts 65a to 65d.

Each nitride semiconductor laser device obtained by breaking the wafer into pieces is designed such that the pad electrode shape viewed from above, namely, the shape of an area where the low reflection parts do not overlap each other, differs from one laser device to another. This can be rephrased that the low reflection part shape differs from one laser device to another.

This is because, while devices 66 and 67 (66' and 67') have the same structure, a device 68 (68') has a reverse structure in terms of the placement of the ridge. Specifically, the device 55 has a ridge on the left-hand side whereas the devices 53 and 54 have ridges on the right-hand side, or vice versa. The coexistence of two types of devices of different structures necessitates discrimination between the two types of devices in, for example, a device characteristics test. Because the two types of devices have different emission spots, the point of introduction of light into an optical fiber or a tester needs to be changed accordingly when the devices are tested for emission wavelength or the like in a characteristics test. The difference in pad electrode shape is used to discriminate one type from the other through image recognition in a tester or a chip mounter.

Accordingly, the apparent shape of the overall pad electrode needs to be varied by differentiating the shapes of the low reflection parts such that at least the discrimination of the device 68 (68') from the devices 66 and 67 (66' and 67') is possible. The devices 66 (66') and 67 (67') which have the same structure does not need to be discriminated from each other but, in FIG. 4 or 5, where the pad electrode 62a and the pad electrode 62b have different apparent shapes, are discriminable from each other.

Returning to the description of how the nitride semiconductor laser device is manufactured, the rear surface of the processed substrate is polished to be thinned down to approximately 100 µm, and then subjected to rear surface treatment. Thereafter, an Ni/Au film or the like is formed as the n-type electrode on the treated rear surface.

The stack is then cleaved along a plane perpendicular to the ridges 61 to form resonator mirrors. A dielectric film (made of Al$_2$O$_3$, SiO$_2$, TiO$_2$, or the like) is formed on the cleaved surface. The stack is then scribed between stripes and broken along the scribe lines into pieces to obtain desired nitride semiconductor laser devices 66 to 68 (66' to 68').

The capacitance of the nitride semiconductor laser devices 66 to 68 (66' to 68') manufactured in this manner is approximately 15 pF. By thus giving the devices 53 to 55a uniform capacitance, the adjustment of a high frequency superposition circuit is facilitated and the manufacture cost is reduced by approximately 10%.

With the structure of this embodiment, a plurality of nitride semiconductor laser devices harvested from a single wafer and having different structures can have the same capacitance and can be discriminated from one another by their structures through image recognition.

The first to fourth embodiments may be combined as seen fit. By combining two or more embodiments, a hybrid structure such as one having a low or high dielectric constant insulating film in which pad electrodes are electrically isolated or low reflection parts are provided on pad electrodes can be created, and the respective effects of the embodiments used in combination are obtained as well.

A nitride semiconductor laser device according to the present invention is applicable to an optical pickup installed in an optical disk drive that plays and records on an optical disk such as a Blu-ray disc.

What is claimed is:

1. A wafer, comprising a plurality of nitride semiconductor laser devices which are to be separated from one another,
    wherein the plurality of nitride semiconductor laser devices each comprise at least one pad electrode that is electrically isolated, and
    wherein, of the plurality of nitride semiconductor laser devices, at least nitride semiconductor laser devices that differ from one another in structure have an equal area on a pad electrode to which a voltage is applied, and have different overall pad electrode shapes on pad electrodes including both the pad electrode to which the voltage is applied and a pad electrode to which no voltage is applied.

2. A wafer according to claim 1, wherein the at least one pad electrode is electrically isolated by a groove.

3. A nitride semiconductor laser device, which is obtained by breaking the wafer according to claim 1 into pieces.

* * * * *